(12) United States Patent
Huang et al.

(10) Patent No.: US 10,008,383 B2
(45) Date of Patent: Jun. 26, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yi-Ming Huang, Tainan (TW); Hsiu-Ting Chen, Tainan (TW); Shih-Chieh Chang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 120 days.

(21) Appl. No.: 14/202,453

(22) Filed: Mar. 10, 2014

(65) Prior Publication Data
US 2015/0255601 A1 Sep. 10, 2015

(51) Int. Cl.
| | | |
|---|---|---|
| H01L 21/02 | (2006.01) | |
| H01L 29/66 | (2006.01) | |
| H01L 29/08 | (2006.01) | |
| H01L 29/165 | (2006.01) | |

(52) U.S. Cl.
CPC .... *H01L 21/02636* (2013.01); *H01L 21/0262* (2013.01); *H01L 21/02381* (2013.01); *H01L 21/02433* (2013.01); *H01L 21/02532* (2013.01); *H01L 21/02576* (2013.01); *H01L 21/02579* (2013.01); *H01L 21/02639* (2013.01); *H01L 29/0847* (2013.01); *H01L 29/66628* (2013.01); *H01L 29/66636* (2013.01); *H01L 29/165* (2013.01)

(58) Field of Classification Search
CPC ........... H01L 21/02381; H01L 21/2433; H01L 21/02532; H01L 21/02576; H01L 21/02579; H01L 21/0262; H01L 21/02636; H01L 21/02639; H01L 29/0847; H01L 29/165; H01L 29/66628; H01L 29/66636
See application file for complete search history.

(56) References Cited

U.S. PATENT DOCUMENTS

| | | | | |
|---|---|---|---|---|
| 7,176,109 B2* | 2/2007 | Ping | ................... | H01L 21/02381 257/E21.171 |
| 8,741,725 B2* | 6/2014 | Johnson | ............ | H01L 21/76237 438/347 |
| 2002/0135029 A1* | 9/2002 | Ping | ................... | H01L 21/02381 257/401 |
| 2009/0261349 A1* | 10/2009 | Lee | ...................... | H01L 29/0847 257/77 |
| 2009/0294860 A1* | 12/2009 | Mowry | ........... | H01L 21/823807 257/368 |

(Continued)

*Primary Examiner* — Cheung Lee
*Assistant Examiner* — Stephen C Smith
(74) *Attorney, Agent, or Firm* — WPAT, P.C., Intellectual Property Attorneys; Anthony King

(57) ABSTRACT

The present disclosure provides a semiconductor structure includes a substrate and an epitaxy region that is partially disposed in the substrate. A doping concentration of the epitaxy region increases from a bottom portion to a top portion of the epitaxy region. The present disclosure also provides a method for manufacturing the semiconductor structure, including forming a recess in a substrate; forming an epitaxy region in the recess; and in situ doping the epitaxy region to form a doping concentration profile increasing from a bottom portion to a top portion of the epitaxy region.

10 Claims, 7 Drawing Sheets

(56) References Cited

U.S. PATENT DOCUMENTS

| | | | |
|---|---|---|---|
| 2012/0056245 A1* | 3/2012 | Kang | H01L 21/0245 257/192 |
| 2012/0112280 A1* | 5/2012 | Johnson | H01L 21/76237 257/347 |
| 2012/0319203 A1* | 12/2012 | Cheng | H01L 29/66666 257/346 |
| 2013/0320449 A1* | 12/2013 | Hoentschel | H01L 21/823807 257/368 |
| 2014/0124904 A1* | 5/2014 | Liao | H01L 21/0237 257/655 |

* cited by examiner

SEMICONDUCTOR STRUCTURE AND MANUFACTURING METHOD THEREOF

BACKGROUND

Semiconductor wafers are processed through semiconductor manufacturing and designed to form various integrated circuits (IC). Integrated circuits are formed on a semiconductor substrate that includes various doped features configured to form various IC devices, such as field effect transistors, diodes and memory devices. Various semiconductor manufacturing operations are employed to form the semiconductor structures including etching, lithography processing, epitaxial processing, and so on. An epitaxial process is applied to the semiconductor substrate to form a source and drain (S/D) region.

In the current semiconductor structures, various doping profiles are employed to the S/D regions including Lightly Doped Drain (LDD) doping, halo doping, Retrograde Channel Profile (RCP) doping and so on. In LDD doping, a separate lightly doped area adjacent to the S/D region is introduced. In halo doping, a separate heavily doped area beneath the S/D region is employed instead. Moreover, in RCP doping, different doping concentration areas are formed beneath the channel area and adjacent to the S/D region. With different types of doping profiles, different doping concentration areas separate from the S/D regions are provided to meet different requirements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
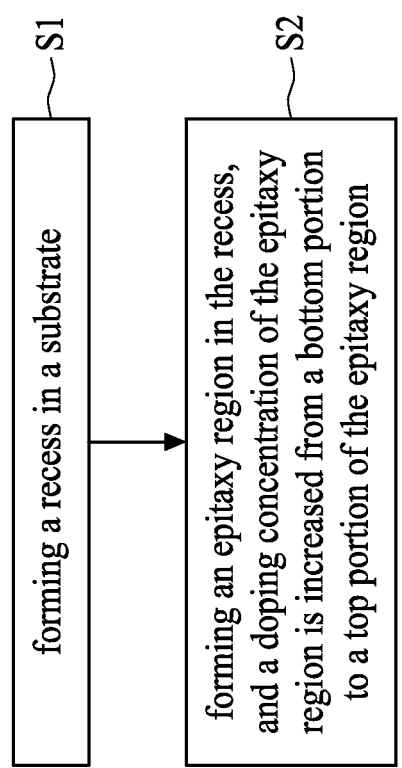
FIG. 1 is a flowchart of a method for manufacturing a semiconductor structure according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some semiconductor structures, the S/D regions are usually formed as a single doping concentration epitaxy region. Accordingly, an out-diffusion phenomenon of the carriers may occur because of the steep concentration gradient between the epitaxy region and the substrate. Moreover, this may cause current leakage and degradation of the semiconductor structures. Consequently, the overall quality of the semiconductor devices may be degraded. Therefore, there is a need for a structure and method of manufacturing a semiconductor structure so as to correct the issue.

Figure 2A:
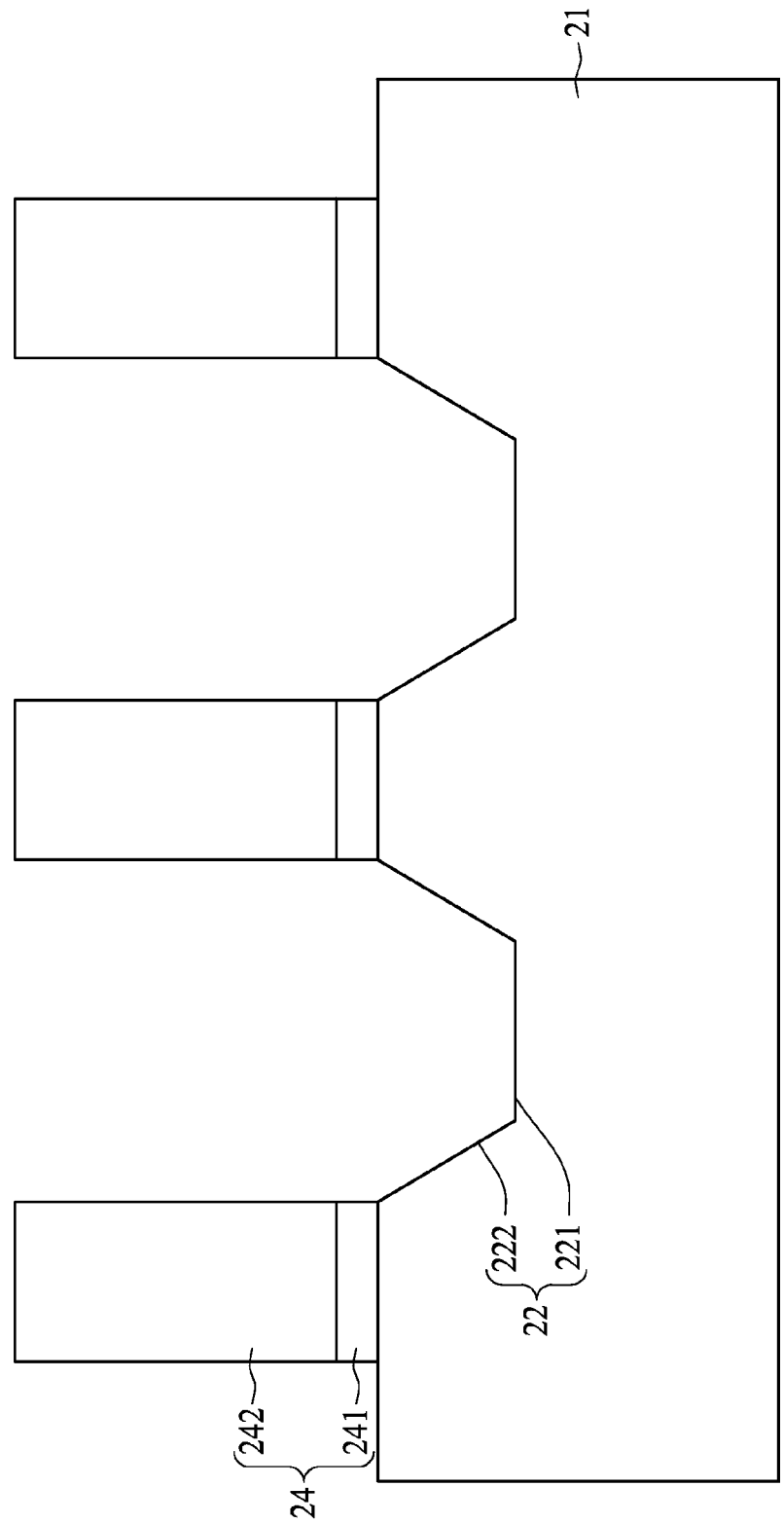
FIG. 2A is a cross-sectional view of a semiconductor structure under one operation according to some embodiments of the present disclosure.
Figure 2B:
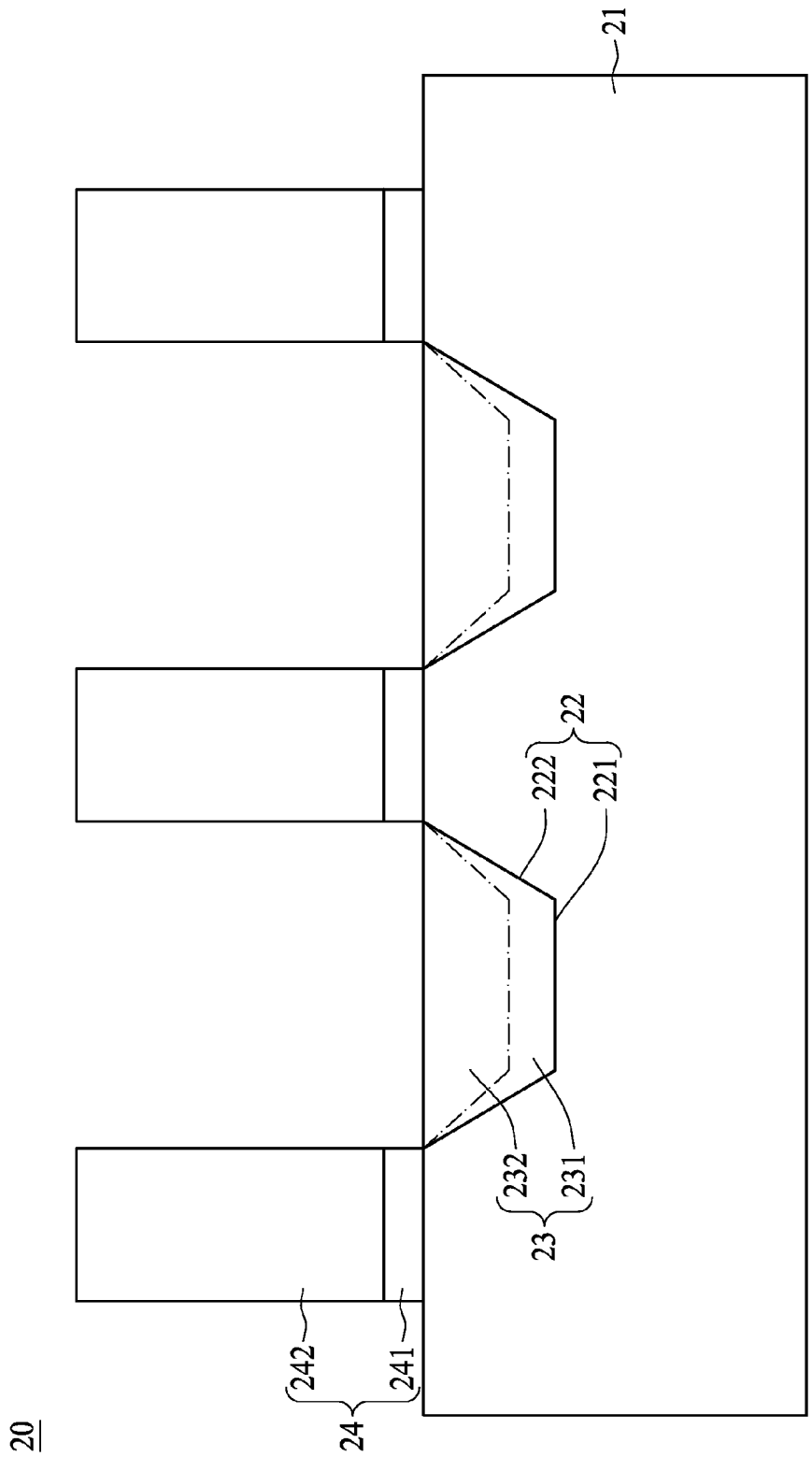
FIG. 2B is a cross-sectional view of a semiconductor structure according to some embodiments of the present disclosure.

FIG. 1 is a flowchart of a method 10 for manufacturing a semiconductor structure according to some embodiments of the present disclosure. FIG. 2A is a cross-sectional view of a semiconductor structure 20 under some operations, and FIG. 2B is a cross-sectional view of a semiconductor structure according to some embodiments of the present disclosure. The method 10 and the semiconductor structure 20 are collectively described with reference to FIG. 1 through FIG. 2B. It is understood that additional operations can be provided before, during, and/or after the method 10.

Referring to FIGS. 1 and 2A, before operation S1 of method 10, an operation for forming a gate stack 24 on the substrate 21 may be included. The gate stack 24 may include a gate dielectric 241 and a gate electrode 242. In some embodiments, the gate dielectric 241 includes silicon oxide or high-k materials. The gate electrode 242 includes conductive materials such as doped polysilicon, metals, metal silicides, metal nitrides, and combinations thereof.

In some embodiments, method 10 begins with operation S1, which forms the recess 22 in the substrate 21 and adjacent to the gate stack 24. The substrate 21 may be a bulk silicon substrate. Alternatively, the substrate 21 may be an elementary semiconductor, such as silicon or germanium in a crystalline structure; a compound semiconductor, such as silicon germanium, silicon carbide, gallium arsenide, gallium phosphide, indium phosphide, indium arsenide, and/or indium antimonide; or combinations thereof. It is possible that the substrate 21 may also include a silicon-on-insulator (SOI) substrate. SOI substrates are fabricated using separation by implantation of oxygen (SIMOX), wafer bonding, and/or other suitable methods.

The recess 22 may be formed by wet etching or dry etching the substrate 21 isotropically or anisotropically. In some embodiments, the recess 22 is formed by a wet etching operation to achieve desired depths, such as in a range of from about 20 nm to about 50 nm. Those skilled in the art will realize, however, that the dimensions recited throughout the description are merely examples, and will change if different formation technologies are used. In some embodiments, the recess 22 further includes a flat bottom surface 221 with a first crystalline plane {100} and recess facets or sidewalls 222 with a second crystalline plane {111}. In other embodiments, the cross sectional shape of the recess 22 may be semi-circular or rectangular.

Referring to FIGS. 1, 2A, and 2B, method 10 proceeds to operation S2, which forms an epitaxy region 23 in the recess 22, and in situ dopes the epitaxy region 23. The epitaxy region 23 is formed to include a doping concentration profile that is increased from a bottom portion 231 to a top portion 232. The in situ doping operation may be performed together with a selective epitaxial growth (SEG), a cyclic deposition etch (CDE), or the combination thereof. The SEG may use Chemical Vapor Deposition (CVD) techniques (e.g., vapor-phase epitaxy (VPE) and/or ultra-high vacuum CVD (UHV-CVD)), molecular beam epitaxy (MBE), and/or other suitable operations.

In some embodiments, the SEG is performed with different semiconductor materials, such as silicon germanium (SiGe) or silicon carbide (SiC), being epitaxially grown in recesses 22. For example, the precursor for growing SiGe may include growth gases such as germane ($GeH_4$, which provides germanium), dichloro-silane (DCS, which provides silicon), and the like. The silicon precursors may include $SiH_4$, $Si_xH_yCl_z$, and/or the like. Furthermore, a carbon containing silicon-source (such as Monomethylsilane ($SiCH_3$) or $SiC_xH_{4-x}$) and/or a carbon containing germane-source (such as $GeCH_3$ or $GeC_xH_{4-x}$) may be added.

In some embodiments, an etching gas is introduced for removing the undesirable SiGe portions. The etching gas may be selected from HCl, HF, $Cl_2$, and combinations thereof. Alternatively, the etching gas may be selected from the group of $C_xF_yH_z$, $C_xCl_yH_z$, $Si_xF_yH_z$, $Si_xCl_yH_z$, with values x, y, and z representing the percentage of the respective elements.

The epitaxy region 23 may be in situ doped with III-V semiconductors. N-type dopant sources may include arsenic vapor and dopant hydrides, such as phosphine ($PH_3$) and arsine ($AsH_3$). P-type dopant sources may include diborane ($B_2H_6$) and boron trichloride ($BCl_3$) for boron doping. Other P-type dopants for Si include Al, Ga and In.

Referring to FIGS. 2A and 2B, the lower doping concentration bottom portion 231 includes the portion in proximity to the bottom surface 221 and sidewalls 222 of the recess 22, and the bottom portion 231 has a substantial U-shape. In some embodiments, the bottom portion 231 of the epitaxy region 23 has a lower doping concentration compared to the top portion 232. Therefore, the epitaxy region 23 has a lower doping concentration in proximity to the bottom surface 221 and sidewalls 222 of the recess 22, which is an interface between the epitaxy region 23 and the substrate 21. In some embodiments, the interface substantially includes the bottom surface 221 and sidewalls 222, and the epitaxy region 23 in proximity to the interface has the lowest doping concentration. Because the doping concentration of the epitaxy region 23 in proximity to the interface is lower than a central portion (referring to the top portion 232 of the epitaxy region 23), a concentration gradient exists between the top portion 232 and the bottom portion 231 of the epitaxy region 23, as well as between the bottom portion 231 of the epitaxy region 23 and the substrate 21. Accordingly, an out-diffusion phenomenon and leakage current can be reduced under the concentration profile provided in the present disclosure. On the other hand, because the top portion 232 of the epitaxy region 23 has a higher doping concentration compared to the bottom portion 231, the resistance of the epitaxy region 23 can be decreased.

Figure 3A:
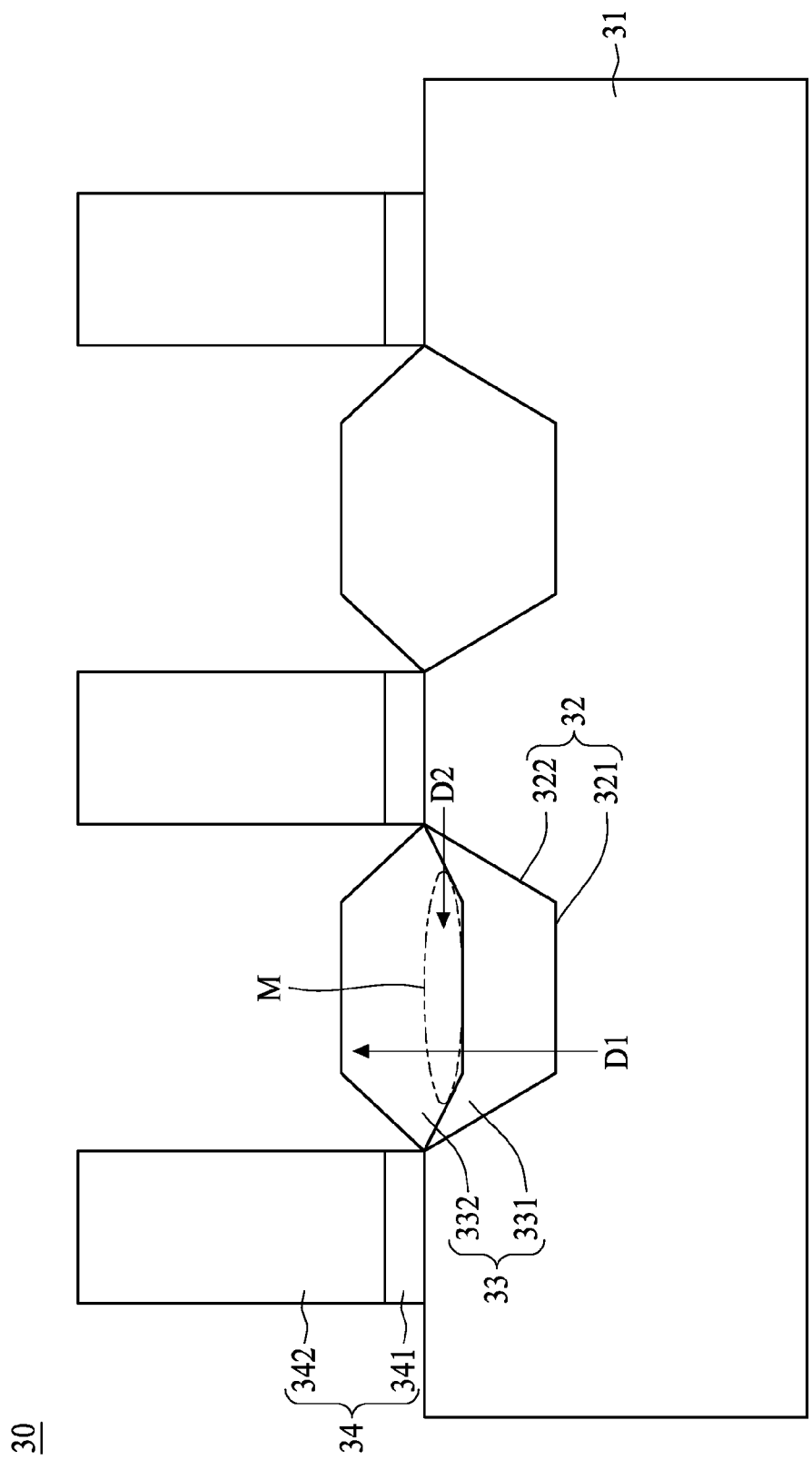
FIG. 3A is a cross-sectional view of a semiconductor structure according to some embodiments of the present disclosure.
Figure 3B:
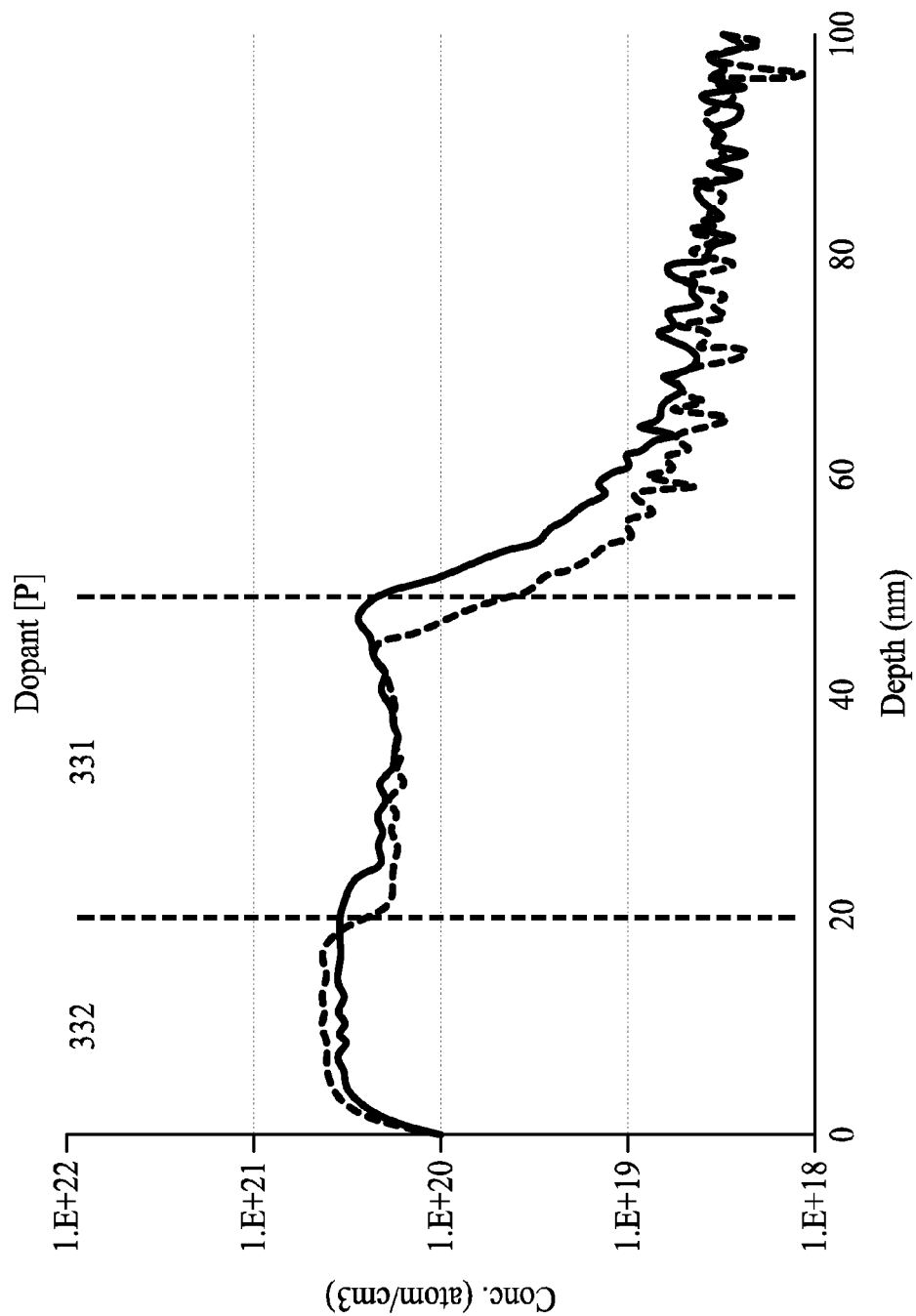
FIG. 3B illustrates a doping concentration profile of an epitaxy region as a function of the depth of the substrate, according to some embodiments of the present disclosure.

FIG. 3A is a cross-sectional view of a semiconductor structure 30 according to some embodiments of the present disclosure. FIG. 3B illustrates a doping concentration of an epitaxy region as a function of the depth (or along the D1 direction) of the semiconductor structure 30 shown in FIG. 3A.

Referring to FIGS. 3A and 3B, in some embodiments, the semiconductor structure 30 includes a gate stack 34, an epitaxy region 33, and a recess 32 accommodating the epitaxy region 33. The gate stack 34 includes a gate dielectric 341 and a gate electrode 342. The recess 32 includes a bottom surface 321 and sidewalls 322. The materials of the gate stack 34 and the forming method of the recess 32 can be referred to the embodiments described in FIGS. 2A and 2B.

In some embodiments, the epitaxy region 33 includes a first epitaxy layer 331 in the recess 32 and a second epitaxy layer 332 on the first epitaxy layer 331. In some embodiments, doping concentration of the first epitaxy layer 331 are different from the doping concentration of the second epitaxy layer 332. Moreover, the epitaxy region 33 may include a multilayer structure with more than two epitaxy layers. The doping concentration of each layer (331 or 332) is different from the other layer in the multilayer structure. In some embodiments, the doping concentration of the second epitaxy layer 332 is greater than the doping concentration of the first epitaxy layer 331. The first epitaxy layer 331 includes the portion in proximity to the bottom surface 321 and sidewalls 322 of the recess 32, and the first epitaxy layer 331 has a substantial U-shape. The second epitaxy layer 332 includes a top portion 332a raised above a top surface 311 of the substrate 31.

The multilayer structure of the epitaxy region 33 may be in situ doped so as to form different doping concentrations in different epitaxy layer 331, 332. The in situ doping operation may be performed together with the SEG, the CDE, or the combination thereof. The SEG may use CVD techniques (e.g., VPE and/or UHV-CVD), MBE, and/or other suitable operations. The semiconductor materials used for the SEG operation can be referred to the embodiment described in FIGS. 2A and 2B. Still referring to FIGS. 3A and 3B, in some embodiments, SiGe is epitaxially grown in the recess 32, and phosphine ($PH_3$) is used for in situ doping. In some embodiments, the growth temperature is maintained to be in a range of from about 600° C. to about 700° C., the pressure is between a range of from about 10 torr to about 50 torr, the carrier gas (for example, $H_2$) flow rate is in a range of from about 10 slm to about 35 slm, germanium source (such as $GeH_4$) flow rate is in a range of from about 100 sccm to about 1000 sccm, and silicon source (such as $SiH_2Cl_2$, $SiH_4$, $Si_2H_6$, or the combination thereof) flow rate is in a range of from about 100 sccm to about 500 sccm. In some embodiments, the flow rate ratio of phosphorous source and silicon source (referred herein as [P]/[Si]), and the flow rate ratio of phosphorous source and germanium source (referred herein as [P]/[$GeH_4$]) is in a range of from about 0.1 to about 20.

Moreover, in some embodiments, the first epitaxy layer 331 and the second epitaxy layer 332 may constitute of different matrix materials. For example, the first epitaxy layer 331 and the second epitaxy layer 332 may both constitute of SiGe but with different stoichiometry. In some embodiments, the first epitaxy layer 331 includes SiGe$_x$ and the second epitaxy layer 332 includes SiGe$_y$, where x and y are different numbers. In other embodiments, the first epitaxy layer 331 may constitute of Si, and the second epitaxy layer 332 may constitute of SiGe.

In some embodiments, when the SEG operation is conducted, the flow rate of phosphine (PH$_3$) is increased from the first epitaxy layer 331 to the second epitaxy layer 332, but the flow rate of germane (GeH$_4$) is increased from the first epitaxy layer 331 to a middle portion M of the epitaxy region 33 and then decreased from the middle portion M to a top of the second epitaxy layer 332 for better silicide formation. In some embodiments, the middle portion M is in the second epitaxy layer 332. For some other embodiments, the middle portion M is a portion formed when the epitaxy region 33 is deposited approximately halfway.

After the SEG operation, one or more annealing operations may be performed to activate the epitaxy regions 33. The annealing processes include rapid thermal annealing (RTA) and/or laser annealing operations.

Still referring to FIGS. 3A and 3B, in some embodiments, the doping concentration may be substantially uniform in each layer 331, 332 of the epitaxy region 33. That is, the doping concentrations in the first epitaxy layer 331 in FIG. 3A is approximately within a range of from about 1×10$^{20}$ to about 1×10$^{21}$ in a depth range about 20 nm to about 50 nm measured from a top surface of the second epitaxy region 332 as shown in FIG. 3A. The doping concentrations of the second epitaxy layer 332 in FIG. 3A is approximately within a rang of from about 1×10$^{20}$ to about 1×10$^{21}$ in a depth range measured from the top surface of the second epitaxy region 332 as shown in FIG. 3A to about 20 nm below the top surface. In some embodiments, the doping concentrations in each epitaxy layers 331 and 332 are different but substantially uniform.

Moreover, because the first epitaxy layer 331 includes the portion in proximity to the bottom surface 321 and sidewalls 322 of the recess 32, the epitaxy region 33 has a lower doping concentration in proximity to the bottom surface 321 and sidewalls 322, which is an interface between the epitaxy region 33 and the substrate 31. In some embodiments, the interface substantially includes the bottom surface 321 and sidewalls 322, and the epitaxy region 33 in proximity to the interface has the lowest doping concentration.

In other words, the doping concentration increases from the first epitaxy layer 331 to the middle portion M in the second epitaxy layer 332 along a transverse direction D2 starting from the sidewall 322 of the recess 32, the lower doping concentration portion (the first epitaxy layer 331), to the middle portion M in the second epitaxy layer 332.

On the other hand, the doping concentration increases starting from the first epitaxy layer 331 to the second epitaxy layer 332 along a vertical direction D1, and starting from the bottom surface 321 of the recess 32 to a top surface of the second epitaxy layer 332. The lower doping concentration portion (the first epitaxy layer 331) is in proximity to the interface between the epitaxy region 33 and the substrate 31.

Therefore, no matter along a directional vertical direction D1 or along a directional transverse direction D2, the doping concentrations of the epitaxy region 33 are lowest at the region in proximity to the interface between the epitaxy region 33 and the substrate 31, and is gradually increasing from said region toward the first epitaxy layer 331 and the second epitaxy layer 332.

Because the doping concentration of the epitaxy region 33 in proximity to the interface is lower than the central portion in the epitaxy region 33, a concentration gradient exists between the second epitaxy layer 332 and the first epitaxy layer 331 of the epitaxy region 33, as well as between the first epitaxy layer 331 of the epitaxy region 33 to the substrate 31. Accordingly, the out-diffusion phenomenon and leakage current is reduced. On the other hand, because the second epitaxy layer 332 of the epitaxy region 33 has a higher doping concentration compared to the first epitaxy layer 331, the resistance of the epitaxy region 33 is decreased.

Those skilled in the art will realize, however, that the dimensions recited throughout the description are merely examples, and will change if different technologies are used. In some embodiments, the doping concentration in the first epitaxy layer 331 and the second epitaxy layer 332 may have a gradient change. For examples, the doping concentration of the second epitaxy layer 332 can be increased from a bottom portion to a top portion. That is, the doping concentration shall increase along the vertical direction D1 and the transverse direction D2 as previously described.

Figure 4A:
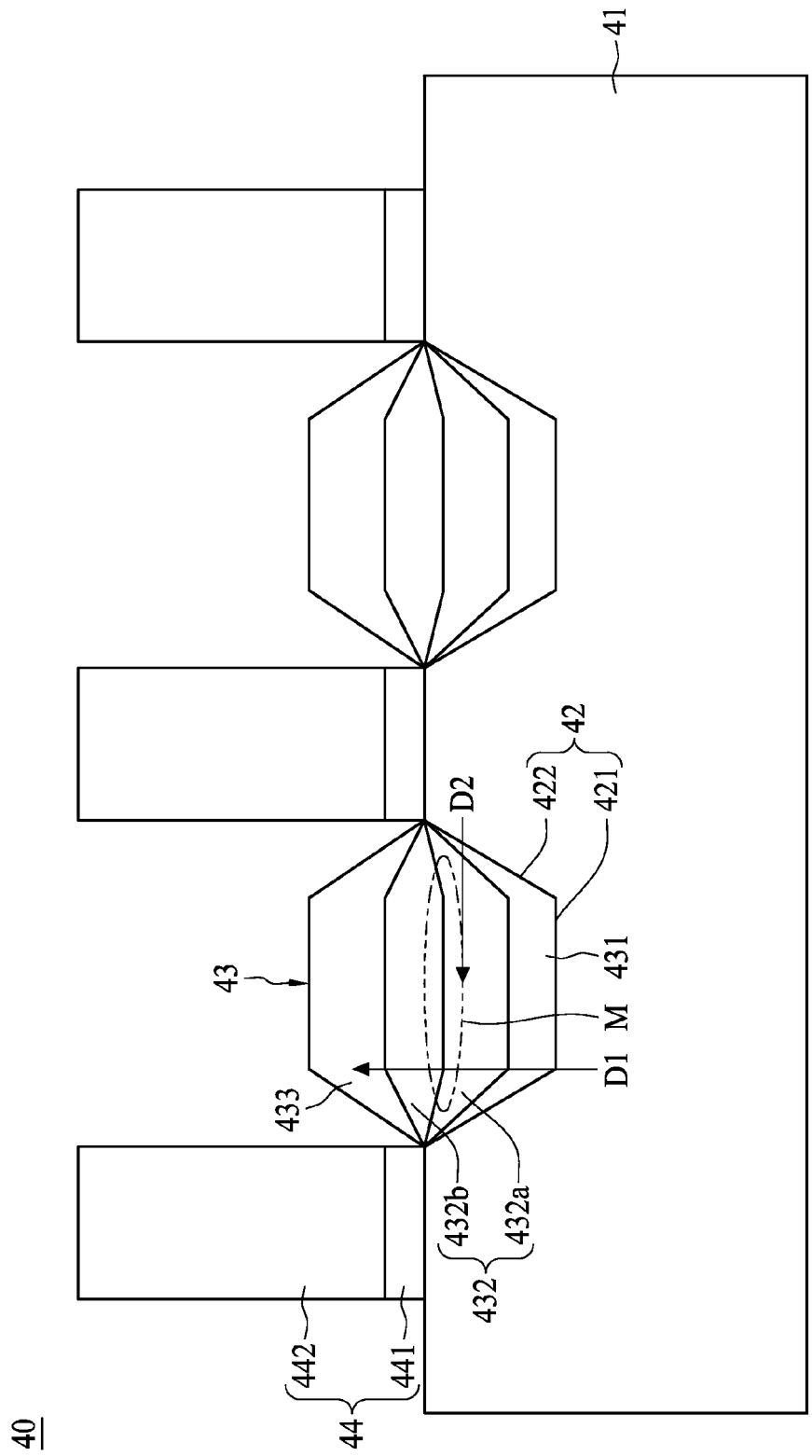
FIG. 4A is a cross-sectional view of a semiconductor structure according to some embodiments of the present disclosure.
Figure 4B:
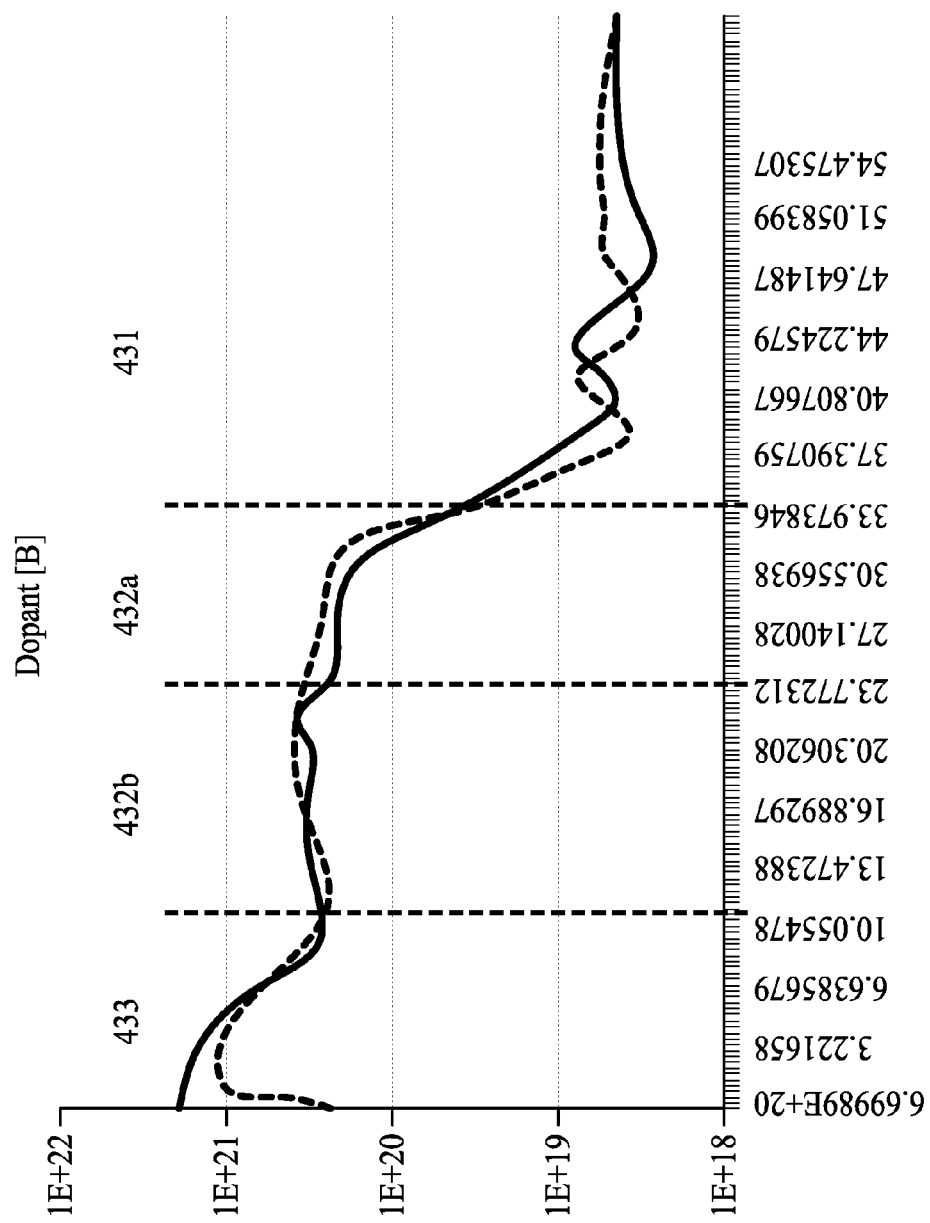
FIG. 4B illustrates a doping concentration profile of an epitaxy region as a function of the depth of the substrate, according to some embodiments of the present disclosure.

FIG. 4A is a cross-sectional view of a semiconductor structure 40 according to some embodiments of the present disclosure. FIG. 4B illustrates a doping concentration of an epitaxy region as a function of the depth (or along the D1 direction) of the semiconductor structure 40 shown in FIG. 4A.

Referring to FIGS. 4A and 4B, in some embodiments, the semiconductor structure 40 includes a gate stack 44, an epitaxy region 43 and a recess 42 accommodating the epitaxy region 43. The gate stack 44 includes a gate dielectric 441 and a gate electrode 442. The recess 42 includes a bottom surface 421 and a sidewall 422. The materials of the gate stack 44 and the method for forming the recess 42 can be referred to embodiments described previously in FIGS. 2A and 2B.

In some embodiments, the epitaxy region 43 includes a first epitaxy layer 431 on the substrate, a second epitaxy layer 432 on the first epitaxy layer 431, and a third epitaxy layer 433 on the second epitaxy layer 432. In some embodiments, doping concentration of each layer (431, 432, or 433) is different from the other layers in the epitaxy region 43. In other words, doping concentration of the first epitaxy layer 431, the second epitaxy layer 432 and the third epitaxy layer 433 are all different. In some embodiments, the doping concentration of the second epitaxy layer 432 is greater than the doping concentration of the first epitaxy layer 431, and the doping concentration of the third epitaxy layer 433 is greater than the doping concentration of the second epitaxy layer 432.

Moreover, in some embodiments, the second epitaxy layer 432 further includes a multilayer structure. For example, two epitaxy sub-layers 432a, 432b can be identified in the second epitaxy layer 432. With the multilayer structure of the second epitaxy layer 432 in the epitaxy region 43, the concentration gradient of the dopants measured from the first epitaxy layer 431 to the third epitaxy layer 433 can be less abrupt compared to the concentration gradient shown in the epitaxy region 33 of FIG. 3A. The doping concentration of each sub-layer 432a, 432b of the multilayer structure in the second epitaxy layer 432 can be either substantially equivalent or different. In some embodiments, the multilayer structure of the second epitaxy layer 432 can have more than two epitaxy sub-layers. In other embodiments, either the first epitaxy layer 431 or the third epitaxy layer 433 can have a multilayer structure (i.e. epitaxy sub-layers).

In some embodiments, the first epitaxy layer 431 include the portion in proximity to the bottom surface 421 and sidewalls 422 of the recess 42, and the first epitaxy layer 431 has a substantial U-shape. The third epitaxy layer 433 includes a top portion 433a raised above a top surface 411 of the substrate 41.

Still referring to FIGS. 4A and 4B, the epitaxy region 43 may be in situ doped so as to form different doping concentration in different epitaxy layer 431, 432, and 433. The in situ doping operation may be performed together with SEG, CDE, mask process, or the combination thereof. The SEG may use CVD techniques (e.g., VPE and/or UHV-CVD), MBE, and/or other suitable operations. The material used for SEG operation can be referred to the embodiments described in FIGS. 2A and 2B.

In some embodiments, SiGe is epitaxially grown in the recess 42, and diborane ($B_2H_6$) is used for in situ doping. In some embodiment, the growth temperature is maintained to be in a range of from about 600° C. to about 700° C., the pressure is between a range of from about 10 torr to about 50 torr, the carrier gas (for example, $H_2$) flow rate is in a range of from about 10 slm to about 35 slm, germanium source (such as $GeH_4$) flow rate is in a range of from about 100 sccm to about 1000 sccm, silicon source (such as $SiH_2Cl_2$, $SiH_4$, $Si_2H_6$, or the combination thereof) flow rate is in a range of from about 100 sccm to about 500 sccm, and boron source (such as $B_2H_6$) flow rate is in a range of from 100 sccm to about 500 sccm. In some embodiments, the flow rate ratio of boron source and silicon source (referred herein as [B]/[Si]), and the flow rate ratio of boron source and germanium source (referred herein as [B]/[GeH4]) may be in a range of from about 0.1 to about 20.

Moreover, in some embodiments, the first epitaxy layer 431, the second epitaxy layer 432, and the third epitaxy layer 433 may constitute of different matrix materials. For example, the first epitaxy layer 431, the second epitaxy layer 432 and the third epitaxy layer 433 may constitute of SiGe but with different stoichiometry. In some embodiments, the first epitaxy layer 431 includes $SiGe_x$, the second epitaxy layer 432 includes $SiGe_y$, and the third epitaxy layer 433 includes $SiGe_z$, where x, y and z are different numbers. In other embodiments, the first epitaxy layer 431 may constitute of Si, and the second epitaxy layer 432 and/or the third epitaxy layer 433 may constitute of SiGe.

In some embodiments, when the SEG operation is conducted, the flow rate of diborane ($B_2H_6$) is increased from the first epitaxy layer 431 to the third epitaxy layer 433, but the flow rate of germane ($GeH_4$) is increased from the first epitaxy layer 431 to a middle portion M of the epitaxy region 43 and then decreased from the middle portion M to a top of the third epitaxy layer 433 for better silicide formation. In some embodiments, the middle portion M is in the second epitaxy layer 432. For some other embodiments, the middle portion M is a portion formed when the epitaxy region 43 is deposited approximately halfway.

After the SEG operation, one or more annealing operations may be performed to activate the epitaxy regions 43. The annealing processes include rapid thermal annealing (RTA) and/or laser annealing operations.

Still referring to FIGS. 4A and 4B, in some embodiments, the doping concentration may be substantially uniform in each epitaxy layer 431, 432, and 433 of the epitaxy region 43. That is, the doping concentrations in the first epitaxy layer 431 in FIG. 4A is approximately within a range of from about $1 \times 10^{18}$ to $1 \times 10^{19}$ in a depth range about 33 nm to about 54 nm measured from a top surface of the third epitaxy region 433 as shown in FIG. 4A. The boron doping concentration of the sub-layer 432a of the second epitaxy layer 432 is approximately within a range of from about $1 \times 10^{20}$ to about $4 \times 10^{21}$ within a depth range from about 23 nm to about 33 nm measured from a top surface of the third epitaxy region 433 as shown in FIG. 4A. The boron doping concentration of the sub-layer 432b of the second epitaxy layer 432 is approximately within a range of from about $4 \times 10^{20}$ to $8 \times 10^{20}$ in a depth range of from about 10 nm to about 23 nm measured from a top surface of the third epitaxy region 433 as shown in FIG. 4A. The boron doping concentration of the third epitaxy layer 433 is approximately within a range of from about $8 \times 10^{20}$ to $3 \times 10^{21}$ in a depth range of from about 7 nm to about 10 nm measured from a top surface of the third epitaxy region 433 as shown in FIG. 4A. In some embodiments, the doping concentration in each epitaxy layers 431, 432, and 433 can be different but substantially uniform.

Moreover, because the first epitaxy layer 431 includes the portion in proximity to the bottom surface 421 and sidewalls 422 of the recess 42, the epitaxy region 43 has a lower doping concentration in proximity to the bottom surface 421 and sidewalls 422, which is a interface between the epitaxy region 43 and the substrate 41. In some embodiments, the interface substantially includes the bottom surface 421 and sidewalls 422, and the epitaxy region 43 in proximity to the interface has the lowest doping concentration.

In other words, the doping concentration increases from the first epitaxy layer 431 to the middle portion M in the second epitaxy layer 432 along a transverse direction D2 starting from the sidewall 422 of the recess 42, the lower doping concentration portion (the first epitaxy layer 431), to the middle portion M in the second epitaxy layer 432.

On the other hand, the doping concentration increases starting from the first epitaxy layer 431, the second epitaxy layer 432, and the third epitaxy layer 433 in the epitaxy region 43 along a vertical direction D1, and starting from the bottom surface 421 of the recess 42 to a top surface of the third epitaxy layer 433. The lower doping concentration portion (the first epitaxy layer 431) is in proximity to the interface between the epitaxy region 43 and the substrate 41.

Therefore, no matter along a directional vertical direction D1 or along a directional transverse direction D2, the doping concentrations of the epitaxy region 43 are lowest at the region in proximity to the interface between the epitaxy region 43 and the substrate 41, and is gradually increasing from said region toward the first epitaxy layer 431, the second epitaxy region 432, and the third epitaxy layer 433.

Because the doping concentration of the epitaxy region 43 in proximity to the interface is lower than the central portion (i.e., the second epitaxy layer 432 and the third epitaxy layer 433) in the epitaxy region 43, a concentration gradient exists between the third epitaxy layer 433 and the second epitaxy layer 432, as well as between the second epitaxy layer 432 and the first epitaxy layer 431. A concentration gradient also exists between the first epitaxy layer 431 of the epitaxy region 43 and the substrate 41. Accordingly, the out-diffusion phenomenon and leakage current is reduced. On the other hand, because the third epitaxy layer 433 of the epitaxy region 43 has a higher doping concentration compared to the first epitaxy layer 431, the resistance of the epitaxy region 43 is decreased.

Those skilled in the art will realize, however, that the dimensions recited throughout the description are merely examples, and will change if different technologies are used. In some embodiments, the doping concentration within the first epitaxy layer 431, the second epitaxy layer 432, and the third epitaxy layer 433 may have a gradient change, respectively. For examples, the doping concentration of the third epitaxy layer 433 can be increased from a bottom portion to a top portion. That is, the doping concentration shall increase along the vertical direction D1 and the transverse direction D2 as previously described.

In accordance with some embodiments, a semiconductor structure has a substrate and an epitaxy region. The epitaxy region is partially disposed in the substrate. A doping concentration of the epitaxy region is increased from a bottom portion to a top portion of the epitaxy region.

In some embodiments of the present disclosure, the epitaxy region further includes a multilayer structure. Each layer of the multilayer structure has a doping concentration different from other layers of the multilayer structure.

In some embodiments of the present disclosure, the doping concentration is substantially uniform in each layer of the multilayer structure.

In some embodiments of the present disclosure, the doping concentration of a layer in proximity to an interface between the epitaxy region and the substrate is the lowest.

In some embodiments of the present disclosure, the semiconductor structure further includes a gate stack on the substrate and adjacent to the top portion of the epitaxy region.

In some embodiments of the present disclosure, a dopant is selected essentially from III-V semiconductors.

In accordance with some embodiments, a semiconductor structure has a substrate, a first epitaxy layer, and a second epitaxy layer. The first epitaxy layer is on the substrate. The second epitaxy layer is on the first epitaxy layer. A doping concentration of the second epitaxy layer is greater than a doping concentration of the first epitaxy layer.

In some embodiments of the present disclosure, the doping concentration of the second epitaxy layer increases from a bottom portion to a top portion of the second epitaxy layer.

In some embodiments of the present disclosure, the second epitaxy layer further includes a multilayer structure. Each layer of the multilayer structure has a doping concentration different from other layers of the multilayer structure.

In some embodiments of the present disclosure, the semiconductor structure further includes a third epitaxy layer on the second epitaxy layer. A doping concentration of the third epitaxy layer is greater than the doping concentration of the second epitaxy layer.

In some embodiments of the present disclosure, the doping concentration of the semiconductor structure increases along a transverse direction substantially parallel to a surface of the substrate, from the substrate to a middle portion in the second epitaxy layer.

In some embodiments of the present disclosure, the semiconductor further includes a gate stack on the substrate and adjacent to the top portion of the epitaxy region.

In some embodiments of the present disclosure, a dopant is selected essentially from III-V semiconductors.

In accordance with some embodiments, a method for manufacturing a semiconductor structure has the operations of forming a recess in a substrate, forming an epitaxy region in the recess, and in situ doping the epitaxy region to form a doping concentration profile increasing from a bottom portion to a top portion of the epitaxy region.

In some embodiments of the present disclosure, the operation of forming the epitaxy region in the recess includes forming a multilayer structure in the recess. A top portion of the multilayer structure is raised above a top surface of the substrate.

In some embodiments of the present disclosure, the operation of forming the multilayer structure includes forming a substantially uniform doping concentration in each layer of the multilayer structure.

In some embodiments of the present disclosure, the multilayer structure is formed by a selective epitaxial growth, a cyclic deposition etch, or a combination thereof.

In some embodiments of the present disclosure, the operation of forming the multilayer structure in the recess includes forming different matrix materials in each layer of the multilayer structure.

In some embodiments of the present disclosure, the method for manufacturing a semiconductor structure further includes forming a gate stack on the substrate and adjacent to the top portion of the epitaxy region.

In some embodiments of the present disclosure, the in situ doping the epitaxy region includes applying a dopant selected essentially from III-V semiconductors.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    an epitaxy region, partially disposed in the substrate; and
    a gate stack on the substrate, the gate stack including a gate dielectric and a gate electrode over the gate dielectric;
    wherein a doping concentration is increased from the substrate to a bottom portion of the epitaxy region, and further increased from the bottom portion of the epitaxy region to a top portion of the epitaxy region; and
    wherein a cross-sectional view of the semiconductor structure shows that a boundary between the epitaxy region and the substrate outlines a tapered structure tapers inwardly from a top surface of the substrate to the bottom portion of the epitaxy region;
    wherein the epitaxy region further comprises:
        a first epitaxy layer partially above the substrate; and
        a second epitaxy layer on the first epitaxy layer and adjacent to the first epitaxy layer; and a doping concentration of the second epitaxy layer being greater than a doping concentration of the first epitaxy layer, and the doping concentration of the first epitaxy layer being greater than a doping concentration of the substrate, and the doping concentration of each of the first epitaxy layer and the second epitaxy layer being substantially uniform; and a boundary between the first epitaxy layer and the second epitaxy layer being above a top surface of the substrate and contacting the gate dielectric tapers inwardly from the top surface of the substrate to a top surface of the first epitaxy layer.

2. The semiconductor structure of claim 1, wherein a dopant is selected from the group consisting essentially of III-V semiconductors.

3. A semiconductor structure, comprising:
    a substrate;
    a gate stack on the substrate, the gate stack including a gate dielectric and a gate electrode over the gate dielectric;

a first epitaxy layer having a bottom surface and sidewalls adjacent to the substrate;
a second epitaxy layer on the first epitaxy layer and adjacent to the first epitaxy layer, and
a third epitaxy layer on the second epitaxy layer and adjacent to the second epitaxy layer,
wherein a doping concentration of the third epitaxy layer is greater than a doping concentration of the second epitaxy layer, and the doping concentration of the second epitaxy layer is greater than a doping concentration of the first epitaxy layer, and the doping concentration of the first epitaxy layer is greater than a doping concentration of the substrate underneath the bottom surface of the first epitaxy layer, and the doping concentration of each of the first epitaxy layer, the second epitaxy layer, and the third epitaxy layer is substantially uniform; and
wherein a cross-sectional view of the semiconductor structure shows that a boundary between the first epitaxy layer and the substrate outlines a tapered structure tapers inwardly from a top surface of the substrate to the bottom surface of the first epitaxy layer, and a boundary between the second epitaxy layer and the third epitaxy layer being above a top surface of the substrate and contacting the gate dielectric tapers inwardly from the top surface of the substrate to a top surface of the second epitaxy layer.

4. The semiconductor structure of claim 3, wherein the doping concentration increases along a transverse direction substantially parallel to the top surface of the substrate, from the substrate to a middle portion in the second epitaxy layer.

5. The semiconductor structure of claim 3, wherein a dopant is selected from the group consisting essentially of III-V semiconductors.

6. A semiconductor structure, comprising:
a substrate;
a gate stack on the substrate, the gate stack including a gate dielectric and a gate electrode over the gate dielectric;
an epitaxy region, partially disposed in the substrate and partially adjacent to the gate stack,
wherein a doping concentration is substantially increased along a vertical direction from the substrate to a bottom portion of the epitaxy region; and
wherein a cross-sectional view of the semiconductor structure shows that a boundary between the epitaxy region and the substrate outlines a tapered structure tapers inwardly from a top surface of the substrate to the bottom portion of the epitaxy region;
wherein the epitaxy region further comprises:
a first epitaxy layer partially above the substrate; and
a second epitaxy layer on the first epitaxy layer and adjacent to the first epitaxy layer; and a doping concentration of the second epitaxy layer being greater than a doping concentration of the first epitaxy layer, and the doping concentration of the first epitaxy layer being greater than a doping concentration of the substrate, and the doping concentration of each of the first epitaxy layer and the second epitaxy layer being substantially uniform; and a boundary between the first epitaxy layer and the second epitaxy layer being above a top surface of the substrate and contacting the gate dielectric tapers inwardly from the top surface of the substrate to a top surface of the first epitaxy layer.

7. The semiconductor structure of claim 6, wherein the doping concentration of the epitaxy region is substantially increased from the bottom portion to a top portion of the epitaxy region along a vertical direction.

8. The semiconductor structure of claim 6, wherein a matrix material of the first epitaxy layer is different from a matrix material of the second epitaxy layer.

9. The semiconductor structure of claim 8, wherein the different matrix materials includes different stoichiometry.

10. The semiconductor structure of claim 6, wherein a top portion of the epitaxy region is raised above the top surface of the substrate.

* * * * *